US010822224B2

(12) United States Patent
Yap et al.

(10) Patent No.: US 10,822,224 B2
(45) Date of Patent: Nov. 3, 2020

(54) PACKAGED PRESSURE SENSOR DEVICE (71) Applicant: NXP USA, Inc., Austin, TX (US)

(72) Inventors: Weng Foong Yap, Chandler, AZ (US); Jinbang Tang, Chandler, AZ (US); Sandeep Shantaram, Austin, TX (US)

(73) Assignee: NXP USA, Inc., Austin, TX (US)

( * ) Notice: Subject to any disclaimer, the term of this patent is extended or adjusted under 35 U.S.C. 154(b) by 450 days.

(21) Appl. No.: 15/787,150

(22) Filed: Oct. 18, 2017

(65) Prior Publication Data
US 2019/0112180 A1 Apr. 18, 2019

(51) Int. Cl.
B81B 3/00 (2006.01)
B81C 1/00 (2006.01)
B81B 7/02 (2006.01)

(52) U.S. Cl.
CPC .......... B81B 3/0027 (2013.01); B81B 3/0086 (2013.01); B81B 7/02 (2013.01); B81C 1/0023 (2013.01); B81C 1/00095 (2013.01); B81C 1/00158 (2013.01); B81C 1/00309 (2013.01); B81B 2201/0264 (2013.01); B81B 2203/0127 (2013.01); B81B 2207/012 (2013.01); B81B 2207/095 (2013.01); B81C 2203/0154 (2013.01)

(58) Field of Classification Search
CPC ....... B81B 3/0027; B81B 7/02; B81B 3/0086; B81B 2207/095; B81B 2207/012; B81B 2203/0127; B81B 2201/0264; B81C 1/0023; B81C 1/00309; B81C 1/00095; B81C 1/00158; B81C 2203/0154
USPC .......................................................... 257/419
See application file for complete search history.

(56) References Cited

U.S. PATENT DOCUMENTS 7,886,609 B2 2/2011 Lo et al.
9,040,335 B2 5/2015 Boon Yew et al.
2010/0281993 A1* 11/2010 Lo .......................... G01L 9/0042
73/724
2011/0036174 A1* 2/2011 Hooper ................. B81B 7/0061
73/721
2013/0154091 A1 6/2013 Wright et al.
2015/0024535 A1 1/2015 Lo
2018/0327255 A1* 11/2018 Endean ............... B81C 1/00293

* cited by examiner

Primary Examiner — Caleen O Sullivan (57) ABSTRACT

Embodiments of a packaged electronic device and method of fabricating such a device are provided, where the packaged electronic device includes: a pressure sensor die having a diaphragm on a front side; an encapsulant material that encapsulates the pressure sensor die, wherein the front side of the pressure sensor die is exposed at a first major surface of the encapsulant material; an interconnect structure formed over the front side of the pressure sensor die and the first major surface of the encapsulant material, wherein an opening through the interconnect structure is generally aligned to the diaphragm; and a cap attached to an outer dielectric layer of the interconnect structure, the cap having a vent hole generally aligned with the opening through the interconnect structure.

12 Claims, 5 Drawing Sheets

PACKAGED PRESSURE SENSOR DEVICE

BACKGROUND

Field

This disclosure relates generally to packaged devices, and more specifically, to packaged pressure sensor devices.

Related Art

Pressure sensors are utilized in a variety of applications, such as in a tire pressure monitoring system (TPMS) for a vehicle. TPMS pressure sensors may be packaged with a radio frequency transmitter that is configured to transmit real-time tire pressure information from the pressure sensor to a main TPMS control unit, which in turn provides an indication (e.g., a warning) to a driver of the vehicle regarding the tire pressure information.

BRIEF DESCRIPTION OF THE DRAWINGS

The present invention may be better understood, and its numerous objects, features, and advantages made apparent to those skilled in the art by referencing the accompanying drawings.

The present invention is illustrated by way of example and is not limited by the accompanying figures, in which like references indicate similar elements, unless otherwise noted. Elements in the figures are illustrated for simplicity and clarity and have not necessarily been drawn to scale.

DETAILED DESCRIPTION

The following sets forth a detailed description of various embodiments intended to be illustrative of the invention and should not be taken to be limiting.
Overview Conventional packaged pressure sensor devices may be implemented using a substrate or lead frame like a QFN (quad flat no-lead), where components are interconnected by wire bond. Such a device may require a large clearance for the wire bonds, which may be greater than 1 mm in some examples, resulting in a large X and Y profile package having a total height of over 2 mm. Further, a housing may be formed around the wire bonds and the pressure sensor on the QFN, which may be filled with gel to protect the pressure sensor. The housing may include a center vent hole to allow pressure from the surrounding environment to reach the pressure sensor through the gel. However, such an arrangement includes the risk of wire bond sagging. Further, the pressure sensor is separated from the surrounding environment by a large distance (e.g., the distance from the pressure sensor to the vent hole may be greater than 1 mm), and a large amount of gel may be required to fill the housing.

Embodiments of the present disclosure provided herein include a packaged pressure sensor device and method of making that uses a redistribution layer (RDL) structure (also referred to as an interconnect structure) to avoid the use of wire bonds and eliminates the risk of wire bond sagging. The RDL structure is formed over the front side of a pressure sensor die (or cell) and another electronic component, such as an integrated circuit (IC) component that implements a radio frequency (RF) transmitter, signal processing circuitry, or both. In some embodiments, the RDL structure has a height in a range of approximately 0.01 mm to 0.05 mm, which provides interconnects or signal paths between components of the packaged pressure sensor device that are much shorter than similar interconnects formed by looping wire bonds, resulting in a faster response time. An opening is formed through the RDL structure, which is generally aligned with a diaphragm on the front side of the pressure sensor die or cell. The opening is filled with gel to protect the diaphragm of the pressure sensor die. Since the opening through the RDL structure requires a much smaller volume of gel (as compared with a much larger volume under the housing), cost of the packaged pressure sensor device may be reduced. A cap may be placed over the RDL structure, with a vent hole generally aligned with the diaphragm, forming a front major surface for pressure sensing. In this manner, the distance between the pressure sensor and the vent hole is greatly reduced (e.g., a distance equivalent to the thickness of the RDL structure, which is may be smaller than the 1 mm clearance required for looping wire bonds). The packaged pressure sensor device also includes backside external connections (which may include solder balls) located on a back major surface of the packaged pressure sensor device that is opposite the front major surface. Such an arrangement prevents any stress introduced by the solder balls attached to the external connections from interfering with operation of the pressure sensor. In some embodiments, a total height of the resulting packaged pressure sensor device is approximately 1 mm, resulting in a lower profile device.

Example Embodiments

FIG. 1-6 show cross-sectional views of various steps performed on a device structure 100 to fabricate a packaged pressure sensor device. The cross-sectional views of device structure 100 are representative of the components included in the device structure 100, which may have a component layout that differs from that shown in FIG. 1-6 (e.g., see FIG. 8). In some embodiments, the device structure 100 is implemented in a 9 mm by 9 mm footprint, which may be differently sized in other embodiments. The single device structure 100 shown in FIG. 1-6 may be representative of a number of device structures formed as part of an array or reconstituted wafer of device structures 100 that are then singulated into a plurality of packaged devices, where the various steps discussed herein are implemented on all device structures of the array.

Figure 1:
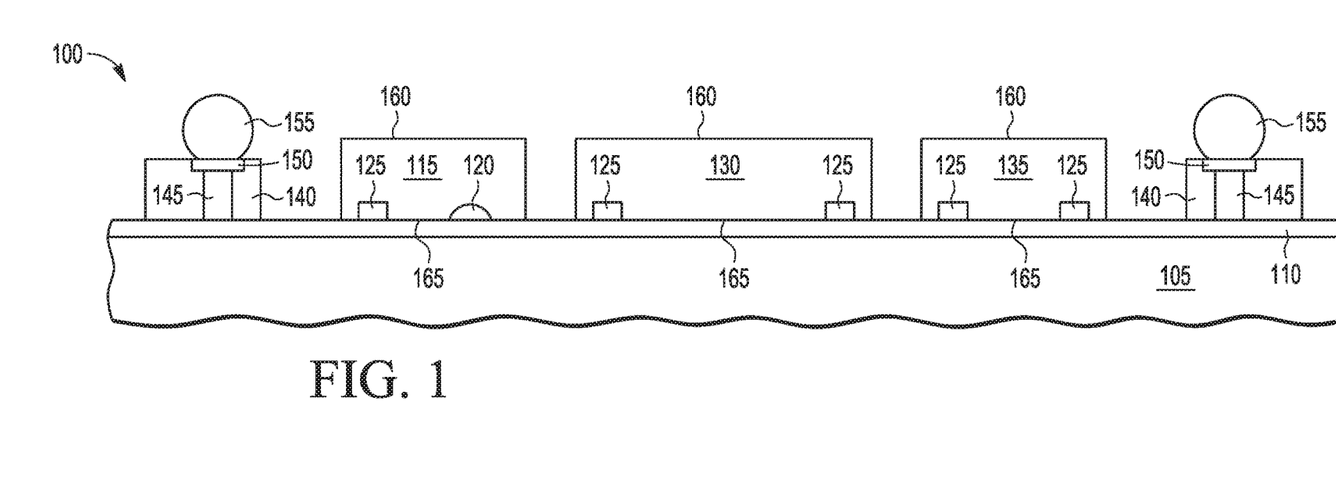
FIG. 1-6 illustrate cross-sectional views depicting various steps of a process for fabricating an example packaged pressure sensor device, according to some embodiments of the present disclosure.

In FIG. 1, device structure 100 includes a number of components attached to a temporary carrier 105 by an adhesive tape 110. In the embodiment shown, such components include a pressure sensor die or cell (P-cell) 115, an integrated circuit (IC) component 130, a gyroscope sensor die or cell (G-cell) 135, and a signal connection structure 140, although additional or fewer components may be included in other embodiments. For example, a separate power source such as a battery (not shown) may also be included in device structure 100 to power the resulting packaged pressure sensor device in some embodiments, while the G-cell 135 may be absent in other embodiments.

P-cell 115, IC component 130, and G-cell 135 each have a back side 160 and a front side 165, with one or more pads 125 formed on the front side 165. P-cell 115, IC component 130, and G-cell 135 has its front side 165 attached to a temporary carrier 105 by tape 110 (e.g., die 115, 130, and 135 are attached in a face-down orientation). In some embodiments, temporary carrier 105 is formed from a polymer film such as ceramic, glass, or similar materials, where a double-sided tape 110 is placed on a surface of the polymer film. In some embodiments, the tape 110 is formed from a polymer film, such as PVC (polyvinyl chloride), polyolefin, polyethylene, or similar material, and is removable in response to UV (ultraviolet light) exposure or temperature excursion (e.g., the tape 110 weakens in response to the UV exposure or temperature excursion). In some embodiments, temporary carrier 105 includes a release layer to release the wafer from the tape 110.

P-cell 115 implements a pressure sensor (e.g., a MEMS (microelectromechanical structure) device) configured to measure pressure in an environment. P-cell 115 includes a diaphragm 120 on the front side 165 as part of the pressure sensor. In some embodiments, the pressure sensor is implemented as a capacitive transducer, where the diaphragm 120 acts as one plate of a capacitive element. The capacitive value of the capacitive element changes with pressure-induced displacement of the diaphragm 120, where the pressure sensor converts the capacitive value into a pressure measurement signal. In other embodiments, the pressure sensor is implemented as a piezo-resistive transducer, where the diaphragm 120 implements piezo-resistive elements, which may be diffused into or bonded to the diaphragm 120. The resistive value of the piezo-resistive elements changes with pressure-induced strain on the diaphragm 120, where the pressure sensor converts the resistive value into a pressure measurement signal.

IC component 130 includes active circuitry that implements signal processing circuitry configured to receive the pressure measurement signal from P-cell 115 (through an interconnect structure 525 further discussed in connection with FIG. 5) and calibrate or correct the pressure measurement signal in order to output accurate pressure readings. For example, the signal processing circuitry may include linearization circuitry to improve linearity in the pressure measurement signal. In some embodiments, the signal processing circuitry of IC component 130 may further include temperature correction circuitry configured to adjust or correct the pressure measurement signal based on a temperature reading from a temperature sensor (not shown) that is implemented in the device structure 100 in some embodiments (e.g., pressure is temperature-dependent). In some embodiments, the signal processing circuitry may implement additional circuitry (e.g., a signal amplifier or a signal monitor) that has configurable settings (e.g., configurable gain or configurable monitoring thresholds) to further adjust the pressure measurement signal to output accurate pressure readings.

IC component 130 also includes a radio frequency (RF) block that implements an RF transmitter and antenna configured to transmit sensor data, including pressure readings, to a main control unit. For example, the IC component 130 and the main control unit may be implemented in a tire pressure monitoring system (TPMS) for a vehicle, where P-cell 115 is used to monitor tire pressure of a given tire on the vehicle. The sensor data received by the TPMS main control unit may be used by a vehicle control system, such as a driver assistance system, to provide information or warnings to the driver (e.g., low tire pressure warning). In some embodiments, the sensor data transmitted to the main control unit also includes temperature readings. In some embodiments, sensor data may also include a unique identifier or serial number of the P-cell 115.

In some embodiments, the RF block of IC component 130 also implements an RF receiver, providing transceiver functionality for bidirectional communication between the RF block and the main control unit. The RF block of IC component 130 implements front end components of the RF transmitter, RF receiver, or both, where the front end components may include but are not limited to a transmitter power amplifier, a receiver low noise amplifier, one or more baluns, one or more filters, a circulator or other coupling device to the antenna, impedance matching elements, an oscillator, a phase locked loop, and other appropriate front end elements. The front end components of the RF block (e.g., an amplifier) may have configurable settings (e.g., configurable gain setting) to adjust the output signal that conveys the sensor data. In some embodiments, the RF block may have an operating frequency that falls within a frequency band of 300 to 500 MHz, although other operating frequencies that fall within other radio frequencies may be implemented in other embodiments.

In some embodiments, IC component 130 also implements control logic configured to control the signal processing circuitry and the RF block. For example, control logic may adjust the configurable settings of the signal processing circuitry, the RF block, or both to achieve accurate pressure readings that are provided to the main RF receiver. In embodiments where the RF block implements an RF receiver, the control logic may receive information from the main control unit that is used to control the configurable settings of the signal processing circuitry, RF block, or both.

In some embodiments, IC component 130 implements a microcontroller that includes one or more of the signal processing circuitry, the control logic, and the RF block. In some embodiments, one or more of the signal processing circuitry, the control logic, and the RF block may be implemented as separate components in the device structure 100. In some embodiments, IC component 130 may further include a power source (e.g., a battery) to power the resulting packaged pressure sensor device.

G-cell 135 implements a gyroscope (e.g., a MEMS (microelectromechanical structure) device) or similar sensor for sensing movement. For example, G-cell 135 may be implemented in the TPMS for a vehicle and is configured to sense whether the vehicle is at rest or in motion. G-cell 135 outputs a velocity measurement that is conveyed to IC component 130 (through an interconnect structure 525 further discussed in connection with FIG. 5). IC component 130 may be configured to transmit sensor data to the main control unit when the vehicle is in motion, and may otherwise be in an idle or standby mode (that does not transmit sensor data) when the vehicle is at rest (e.g., when the tires are not spinning or have zero velocity).

Signal connection structure 140 includes a dielectric material in which a number of conductive conduits or vias 145 are embedded. Conductive conduits 145 are formed from a conductive material that extends through the dielectric material of signal connection structure 140. Examples of the conductive material include but are not limited to copper, aluminum, silver, gold, an alloy or composite of one or more suitable conductive metals, and the like. The conductive conduits 145 are each exposed at a bottom surface 165 of the signal connection structure 140, which is attached to temporary carrier 105 by tape 110. The conductive conduits 145 each have a ball attach pad 150 that is exposed at a top surface 160 of the signal connection structure 140, with a solder ball 155 respectively attached to each of the ball attach pads 150. Some embodiments may not include solder balls 155. In the embodiment shown, signal connection structure 140 is located around the periphery or edge of the device structure 100 and surrounds P-cell 115, IC component 130, and G-cell 135, but may be differently located or differently shaped in other embodiments.

The active circuitry and sensor die or cells described herein can be implemented on a semiconductor substrate or wafer, which can be any semiconductor material or combinations of materials, such as gallium arsenide, silicon germanium, silicon-on-insulator (SOI), silicon, monocrystalline silicon, the like, and combinations of the above. The active circuitry is formed using a sequence of numerous process steps applied to the semiconductor wafer, including but not limited to depositing semiconductor materials including dielectric materials and metals, such as growing, oxidizing, sputtering, and conformal depositing, etching semiconductor materials, such as using a wet etchant or a dry etchant, planarizing semiconductor materials, such as performing chemical mechanical polishing or planarization, performing photolithography for patterning, including depositing and removing photolithography masks or other photoresist materials, ion implantation, annealing, and the like. Examples of components implemented in the active circuitry include but are not limited to a processor, memory, logic, analog circuitry, sensor, MEMS (microelectromechanical systems) device, a standalone discrete device such as a resistor, inductor, capacitor, diode, power transistor, and the like. In some embodiments, the active circuitry may be a combination of the components listed above or may be another type of microelectronic device. The wafer is then singulated into a number of sensor die or cells or active circuitry components, which may be then implemented in the device structure 100.

Figure 2:
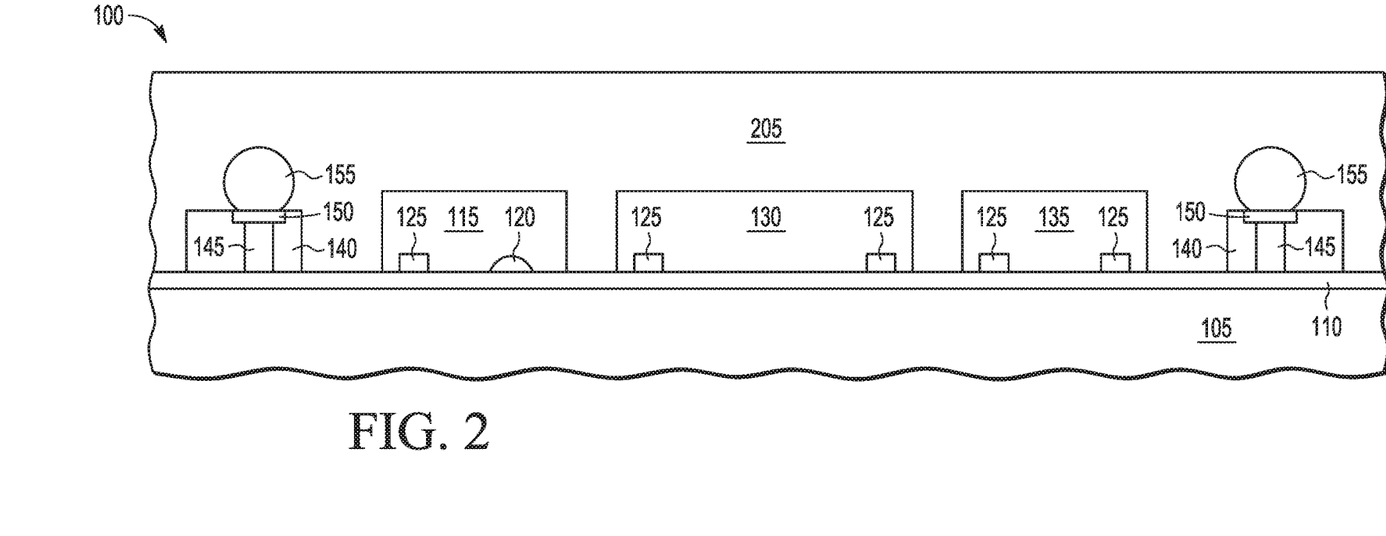

FIG. 2 shows the device structure 100 after overmolding. P-cell 115, IC component 130, G-cell 135, and signal connection structure 140 are encapsulated with an encapsulant material such as mold compound 205, which covers the back sides 160 and side walls of P-cell 115, IC component 130, and G-cell 135. In some embodiments, mold compound 205 may be a biphenyl type or multi-aromatic type epoxy resin, but may be other types of encapsulating materials in other embodiments. The overmolding may be performed by an encapsulating method, such as transfer molding or other types of other encapsulating methods. In some embodiments, overmolding results in a reconstituted wafer of a plurality of device structures encapsulated in the mold compound 205, where the reconstituted wafer has a front side still attached to temporary carrier 105 by tape 110.

Figure 3:
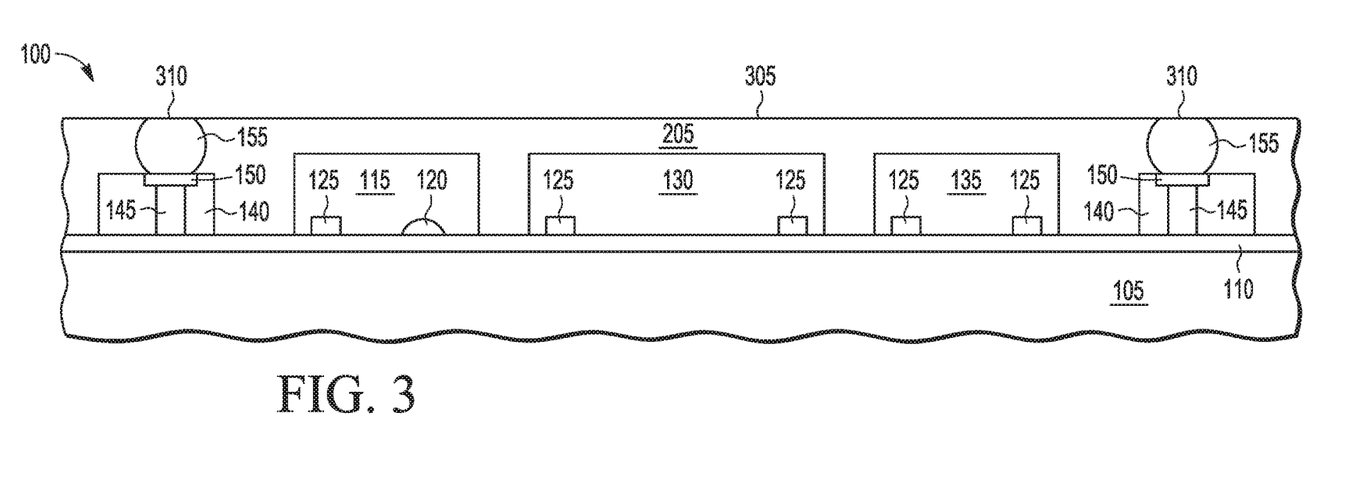

FIG. 3 shows the device structure 100 after grinding. A portion of the mold compound 205 is removed by a grinding step, such as chemical mechanical polishing (CMP), to reveal a new back surface (or major surface) 305 of the mold compound 205. The remaining portion of the mold compound 205 continues to cover and embed back sides 160 and side walls of P-cell 115, IC component 130, and G-cell 135. In some embodiments, the grinding is performed on a back side of the reconstituted wafer. Surfaces 310 of the solder balls 155 are also exposed in the back surface 305 to provide backside external connections for the resulting packaged pressure sensor device, as further discussed below.

Figure 4:
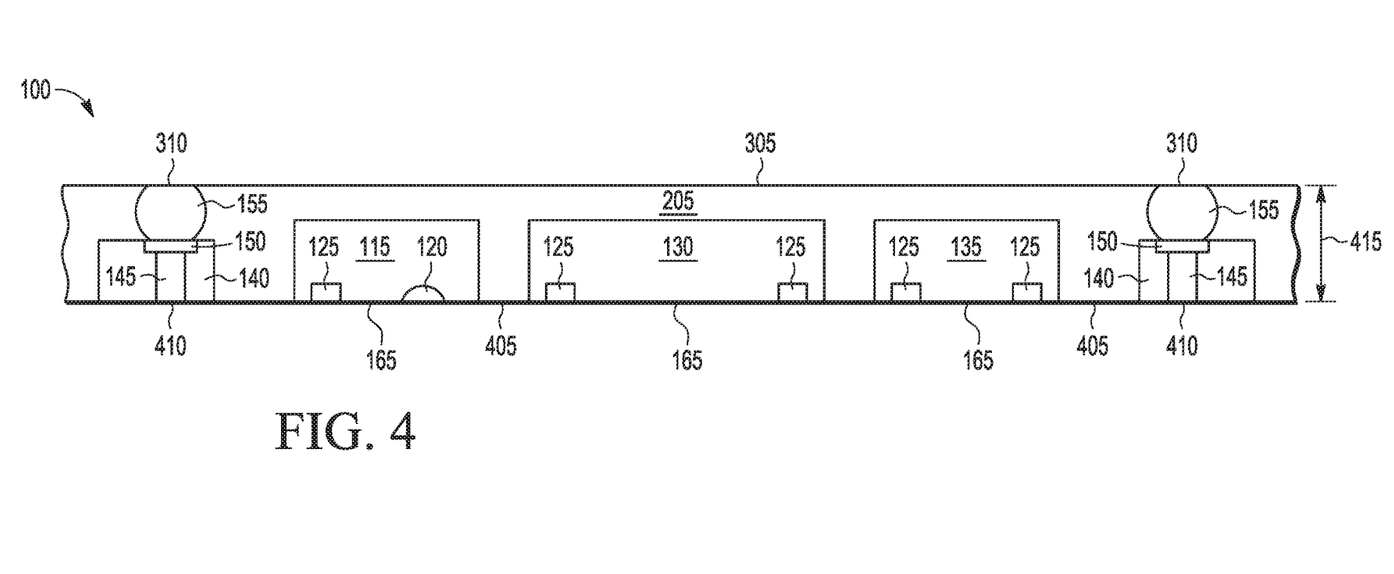

FIG. 4 shows the device structure 100 after the temporary carrier 105 and tape 110 have been removed, which shows front sides 165 of P-cell 115, IC component 130, G-cell 135, and signal connection structure 140 exposed through a front surface (or major surface) 405 of the mold compound 205. The conductive conduits 145 each have a surface 410 exposed at the front side 165 of signal connection structure 140, which is also referred to as being exposed at the front surface 405 of the mold compound 205. The device structure 100 (or thinned reconstituted wafer) has a resulting thickness or height 415 that is approximately 0.65 mm in some embodiments.

Figure 5:
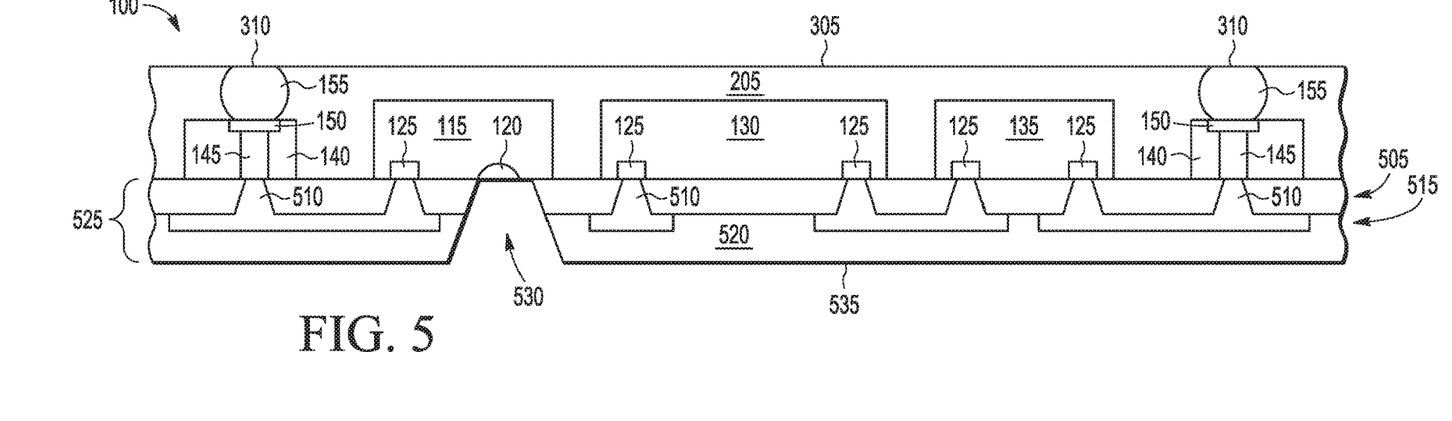

FIG. 5 shows the device structure 100 after an interconnect structure 525 has been formed over the front sides 165 of P-cell 115, IC component 130, G-cell 135, and signal connection structure 140 and major surface 405 of mold compound 205. Interconnect structure 525 includes a number of dielectric layers and conductive layers to form interconnects that communicatively couple P-cell 115, IC component 130, G-cell 135, and signal connection structure 140. In some embodiments, interconnect structure 525 implements a fan-out wafer level packaging (FOWLP) arrangement to connect pads 125 of P-cell 115, IC component 130, G-cell 135 to surfaces 410 of the conductive conduits 145 of signal connection structure 140 arranged around the periphery or edge of the device structure 100. In some embodiments, the interconnect structure 525 is formed by a photolithography process. The photolithography process may include depositing a first dielectric layer 505 over (e.g., directly on) the front sides 165 of P-cell 115, IC component 130, G-cell 135, and signal connection structure 140, and over (e.g., directly on) the major surface 405 of mold compound 205. Dielectric layer 505 is a layer of insulating material that may be conformally deposited in some embodiments, or spun-on in other embodiments. In some embodiments, the insulating material used to form interconnect structure 140 includes a positive or negative photo resist material. It is preferred that a soft photo resist material is used, which serves to protect the diaphragm 120 from damage during formation of the interconnect structure 525.

Dielectric layer 505 is patterned, developed, and etched to form a number of openings or via holes 510 through dielectric layer 505 to expose pads 125. A conductive layer 515 is deposited over the dielectric layer 505 and into openings 510, which are then patterned to form the interconnects. Conductive layer 515 is a conductive material that may be conformally deposited, sputtered, printed, or otherwise applied. Examples of the conductive material include but are not limited to copper, aluminum, silver, gold, an alloy or composite of one or more suitable conductive metals, and the like. Another dielectric layer 520 (of the insulating material) is then deposited over the interconnects, providing an outer surface 535 of the interconnect structure 525. The described steps may be repeated to form additional layers of interconnects in the interconnect structure 525, with a last dielectric layer providing the outer surface 535. The interconnects of interconnect structure 525 provide redistributed routing that eliminates the need for wire bonds and allows for the assembly of a low profile pressure sensor package.

An opening 530 that is generally aligned to diaphragm 120 is also formed through the interconnect structure 525. The opening 530 may be formed by patterning, developing, and etching the dielectric layers (of the insulating material) of the interconnect structure 525, which exposes diaphragm 120 in the opening 530. In the embodiment shown, the opening 530 has sloped side walls with a narrowest portion of the opening 530 closest to the front side 165 of the p-cell 115, although the opening 530 may be differently shaped in other embodiments (e.g., parallel vertical side walls). In some embodiments, the narrowest portion of the opening 530 is wider than the diaphragm 120 (e.g., a perimeter of the opening 530 surrounds a perimeter of the diaphragm 120) to ensure that the opening fully surrounds and exposes the diaphragm 120. It is noted that "generally aligned" indicates that the opening 530 is formed over diaphragm 120 such that diaphragm 120 is fully exposed within opening 530, where the diaphragm 120 may be centered within the opening 530 or off-centered within the opening 530. For example, in the embodiment shown, the diaphragm 120 is off-centered within opening 530, which may be due to any minor imperfections or deviations, if any, that arise from usual and expected process abnormalities that may occur during fabrication of the interconnect structure 525, which fall within expected tolerances.

Figure 6:
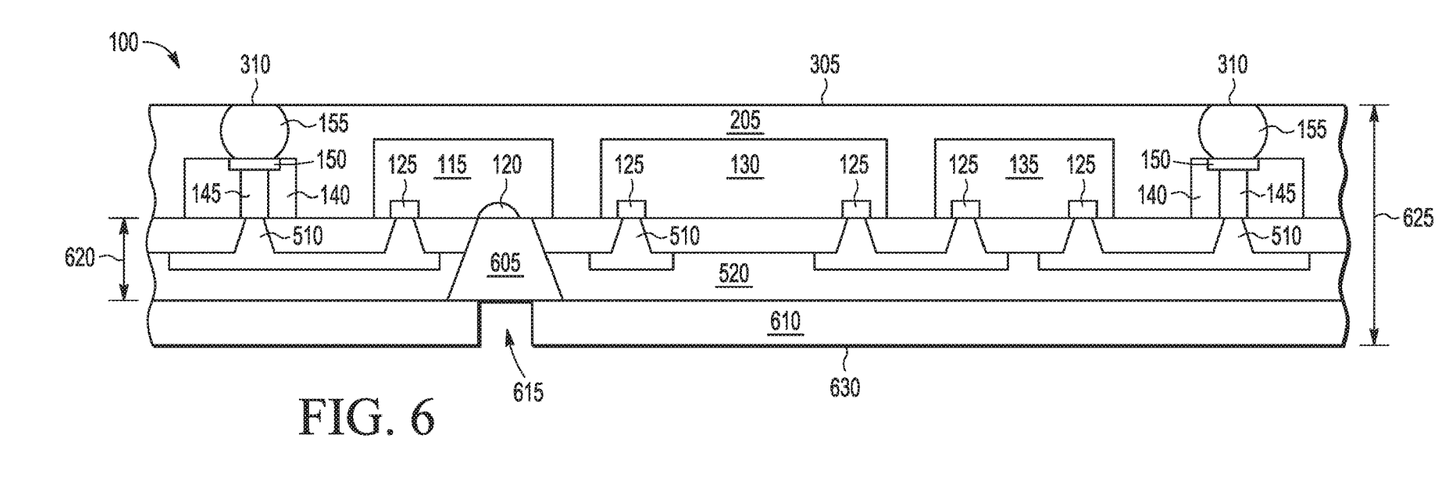

FIG. 6 shows the device structure 100 after a gel material 605 is deposited within opening 530. In some embodiments, gel 605 is a low modulus and low viscosity material (e.g., a low viscosity silicone potting gel). The gel material 605 protects the diaphragm 120 from damage during and after the fabrication process, while also allowing pressure to be conveyed through gel 605 and sensed by diaphragm 120. The gel material 605 may be applied by dispensing, printing or spin coating, which is then cured (e.g., by heat or ultraviolet light radiation). In the embodiment shown, the gel material 605 fills substantially the entire opening 530, although the gel material 605 may fill less than the entire opening 530 in other embodiments.

FIG. 6 also shows the device structure 100 after a cap 610 is attached to an outer surface 535 of the last dielectric layer of the interconnect structure 525. Cap 610 includes a vent hole 615 (or cavity that extends through cap 610) that is generally aligned with the diaphragm 120 over opening 530, where the vent hole 615 is not required to be centered in the cap 610. In the embodiment shown, vent hole 615 is narrower than opening 530, which protects the gel 605 and the diaphragm 120 of p-cell 115 from damage (e.g., debris in the environment), while still allowing pressure from the environment to be sensed by diaphragm 120. In the embodiments shown, the diaphragm 120 is separated from the vent hole 615 by the height 620 of the interconnect structure 525, which minimizes the distance between diaphragm 120 and the surrounding environment, providing a more direct measurement of pressure in the environment. In some embodiments, the vent hole 615 is smaller than a widest portion of the opening 530 (e.g., a perimeter of the opening 530 surrounds a perimeter of the vent hole 615). It is noted that "generally aligned" also indicates that the vent hole 615 is located over opening 530 such that a portion of the opening 530 is exposed within the vent hole 615, where the vent hole 615 may be centered over the opening 530, may be centered over the diaphragm 120, or may be positioned elsewhere over the opening 530, where in each case the diaphragm 120 may be centered or off-centered within the opening 530.

In some embodiments, cap 610 (with the exception of the portion of cap 610 that overlies opening 530) makes direct contact with the entire major surface 535 of the last dielectric layer of the interconnect structure 525, which also protects the interconnect structure 525 from damage (e.g., debris in the environment). An outer surface 630 of cap 610 may be referred to as a front major surface of the resulting packaged pressure sensor device that provides pressure sensing, and outer surface 305 may be referred to as a back major surface of the resulting packaged pressure sensor device that provides external connections (also referred to as backside external connections), such as to a printed circuit board (PCB) shown in FIG. 7.

In some embodiments, cap 610 is a metal cap that is attached by adhesive to the outer surface 535 of the interconnect structure 525. In such embodiments, the gel material 605 (if present near corners of the opening 530 at the outer surface 535) may need to be removed before attaching the metal cap 610 (e.g., see gel 605 in FIG. 7). The metal cap may be pre-stamped and placed on the device structure 100 (or as a pre-stamped sheet placed over all device structures 100 of a reconstituted wafer). In other embodiments, cap 610 is a B-stage epoxy sheet that is attached to the outer surface 535 of the interconnect structure 525 and then cured (e.g., by heat or ultraviolet light radiation). The epoxy sheet may be a pre-cutout sheet and placed on the device structure 100 (or as a pre-cutout sheet placed over all device structures 100 of a reconstituted wafer). In some embodiments, the cap 610 has a height of approximately 0.3 mm.

In embodiments where the device structure 100 is part of a reconstituted wafer, the device structures 100 are then singulated into separate packaged pressure sensor devices. In some embodiments, the interconnect structure 525 as shown has a thickness or height 620 of approximately 40 microns (or 0.04 mm), although the height 620 would increase as additional layers were implemented (e.g., a height of approximately 20 microns for each dielectric layer). The height of the p-cell 115 may be approximately 0.4 mm in some embodiments. The combined height 625 of the resulting packaged pressure sensor device shown in FIG. 6 may be approximately 1 mm in some embodiments. These dimensions may be of other values in other embodiments.

Figure 7:
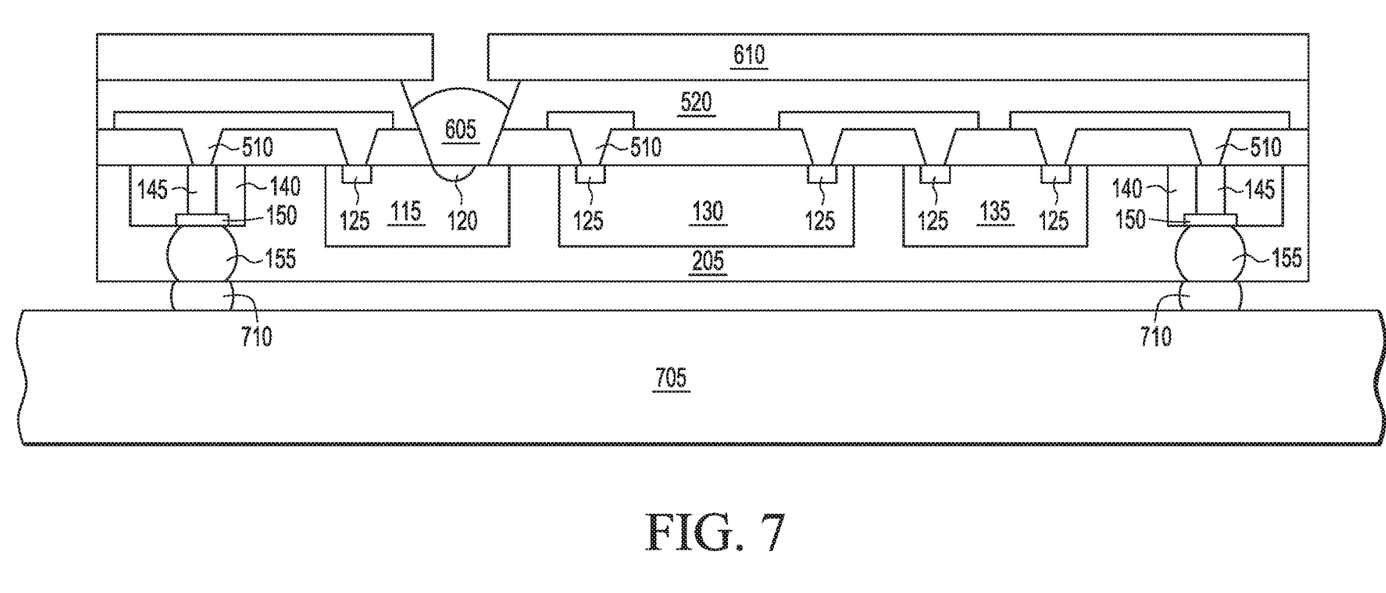
FIG. 7 illustrates a cross-sectional view of an example packaged pressure sensor device attached to a printed circuit board (PCB), according to some embodiments of the present disclosure.

FIG. 7 illustrates a cross-sectional view of an example packaged pressure sensor device attached to a printed circuit board (PCB) 705. It is noted that the packaged pressure sensor device is shown in a flipped orientation (as compared to FIG. 6) with pressure sensing surface 630 at the top of the figure and external connection surface 305 at the bottom of the figure. In the embodiment shown, solder bumps or solder balls 710 are used to attach and electrically connect the exposed surfaces 310 of solder balls 155 to landing pads on the PCB in a ball grid array (BGA) configuration. In other embodiments, the exposed surfaces 310 located on back surface 305 may be mounted to the PCB in a land grid array (LGA) configuration with solder paste, although other connection configurations may be implemented in other embodiments.

External connections are implemented from pads 125 of P-cell 115, IC component 130, and G-cell 135, through interconnects of the interconnect structure 525, and through respective conductive conduits 145 to solder balls 155. In some embodiments, the solder bumps 710 may add 0.3 mm to the height of the device, still resulting in a low profile packaged device. PCB 705 may include electrically conductive features on a non-conductive substrate, which may be a flexible type PCB using polyimide or a rigid type PCB using FR4 or BT resin.

Figure 8:
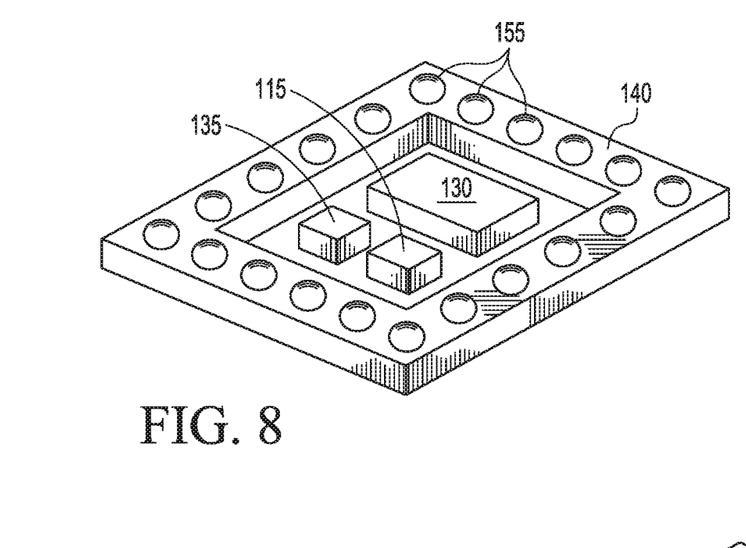
FIG. 8 illustrates a perspective view of an example layout of components included in the packaged pressure sensor device, according to some embodiments of the present disclosure.

FIG. 8 shows a perspective view of an example layout of components included in the packaged pressure sensor device. In some embodiments, the layout is implemented in a 9 mm by 9 mm layout, although other sized layouts may be used in other embodiments. In the embodiment shown, signal connection structure 140 having attached solder balls 155 surrounds P-cell 115, G-cell 135, and IC component 130 around the periphery or edge of the layout. The orientation of the components shown in FIG. 8 (e.g., face-down orientation) is similar to the orientation of the components shown in FIG. 1. In some embodiments, IC component 130 may be implemented as multiple components (e.g., a microcontroller, an RF block, a power source). In other embodiments, additional components may be included in the layout (e.g., a temperature sensor cell).

Figure 9:
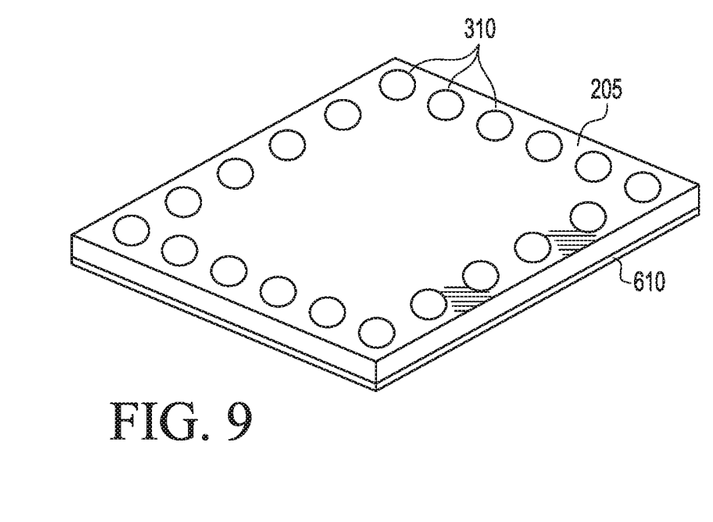
FIGS. 9 and 10 illustrate perspective views of an example packaged pressure sensor device, according to some embodiments of the present disclosure.

FIG. 9 shows a perspective view of a resulting packaged pressure sensor device fabricated from the layout of components shown in FIG. 8. The back surface 305 of mold compound 205 is shown facing upwards, with a plurality of surfaces 310 of solder balls 155 exposed through mold compound 205 along the periphery or edge of the resulting packaged pressure sensor device. Cap 610 is shown facing downwards.

Figure 10:
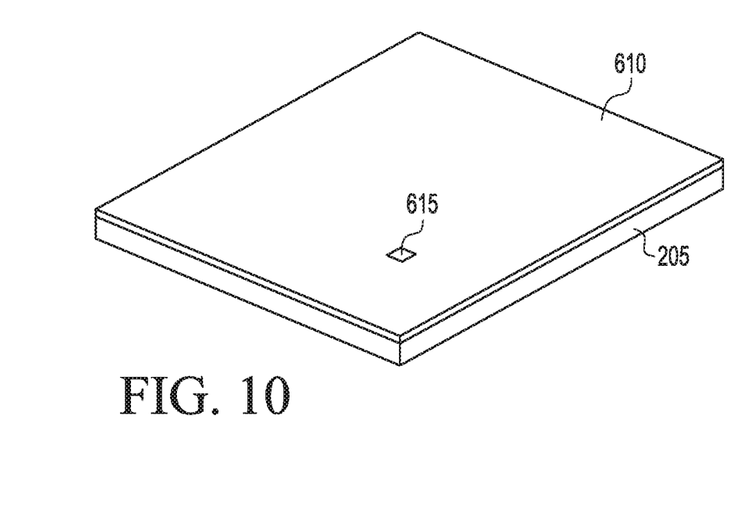

FIG. 10 shows another perspective view of the packaged pressure sensor device with the back surface 305 of mold compound facing downwards. Cap 610 is shown facing upwards, with vent hole 615 providing access to the diaphragm 120 of the p-cell 115.

It is noted that in some embodiments, a p-cell in the presently disclosed packaged pressure sensor device may undergo comparable strain as a p-cell that is conventionally packaged using housing filled with gel, over a range of temperatures from −40 C to 150 C. While both packages experience a stress-free region over the diaphragm at 150 C, both p-cells also experience higher stress as temperature decreases down to −40 C. For example, in some embodiments, at −40 C, the presently disclosed packaged pressure sensor device experiences maximum stress at the corners of the vent hole of the cap. However, with some embodiments, the region above the p-cell's diaphragm in the presently disclosed packaged pressure sensor device remains in range of strain comparable to that experienced by the p-cell's diaphragm in a conventional package. The maximum stress experienced by the presently disclosed package pressure sensor device may also be reduced by using epoxy material as the cap, which has a comparable CTE (coefficient of thermal expansion) as the underlying mold compound of the package.

By now it should be appreciated that there has been provided a packaged pressure sensor device and method of making that uses an interconnect structure (or RDL structure) formed over the front side of a pressures sensor die (or cell) and another electronic component, such as an integrated circuit (IC) component that implements a radio frequency (RF) transmitter, signal processing circuitry, or both. An opening is formed through the interconnect structure, which is generally aligned with a diaphragm on the front side of the pressure sensor die or cell, and is filled with gel. A cap may be placed over the RDL structure, with a vent hole generally aligned with the diaphragm, forming a front major surface for pressure sensing. The packaged pressure sensor device may also include backside external connections (which may include solder balls) located on a back major surface of the packaged pressure sensor device that is opposite the front major surface.

In an embodiment of the present disclosure, a packaged electronic device is provided, which includes: a pressure sensor die having a diaphragm on a front side; an encapsulant material that encapsulates the pressure sensor die, wherein the front side of the pressure sensor die is exposed at a first major surface of the encapsulant material; an interconnect structure formed over the front side of the pressure sensor die and the first major surface of the encapsulant material, wherein an opening through the interconnect structure is generally aligned to the diaphragm; and a cap attached to an outer dielectric layer of the interconnect structure, the cap having a vent hole generally aligned with the opening through the interconnect structure.

One aspect of the above embodiment provides that the cap includes a metal lid.

Another aspect of the above embodiment provides that the cap includes a cured epoxy sheet.

Another aspect of the above embodiment provides that the packaged electronic device further includes: a gel present within the opening of the interconnect structure.

Another aspect of the above embodiment provides that a distance from the diaphragm to the cavity in the cap is less than 50 microns.

Another aspect of the above embodiment provides that the packaged electronic device further includes: a backside signal connection having a first surface exposed at the first major surface of the encapsulant material and connected to the interconnect structure, and a second surface exposed at a second major surface of the encapsulant material.

A further aspect of the above embodiment provides that the packaged electronic device further includes: a plurality of backside signal connections located around a periphery of the packaged electronic device.

A still further aspect of the above embodiment provides that the packaged electronic device further includes: a plurality of solder bumps attached to the plurality of backside signal connections.

Another aspect of the above embodiment provides that the pressure sensor die further includes at least one pad exposed at the first major surface of the encapsulant material and connected to the interconnect structure.

Another aspect of the above embodiment provides that the packaged electronic device further includes: an integrated circuit (IC) component including a radio frequency (RF) transmitter, the IC component having at least one pad exposed at the first major surface of the encapsulant material and communicatively coupled to the pressure sensor die through the interconnect structure.

A further aspect of the above embodiment provides that the packaged electronic device further includes: a gyroscope sensor die communicatively coupled to the IC component through the interconnect structure.

In another embodiment of the present disclosure, a method for fabricating a packaged electronic device is provided, the method including: attaching a front side of a pressure sensor die to a carrier, the pressure sensor die having a diaphragm on the front side; overmolding the pressure sensor die with an encapsulant material to form an embedded pressure sensor die, wherein the front side of the pressure sensor die is exposed at a first major surface of the encapsulant material; removing the embedded pressure sensor die from the carrier; forming an interconnect structure over the front side of the pressure sensor die and the first major surface of the encapsulant material, wherein an opening through the interconnect structure is generally aligned to the diaphragm; and attaching a cap to an outer dielectric layer of the interconnect structure, the cap having a vent hole generally aligned with the opening through the interconnect structure.

One aspect of the above embodiment provides that the cap includes a metal lid.

Another aspect of the above embodiment provides that the cap includes a B-stage epoxy sheet; and the method further includes: curing the B-stage epoxy sheet after attaching the B-stage epoxy sheet to the outer dielectric layer.

Another aspect of the above embodiment provides that the method further includes: spinning a gel into the opening through the interconnect structure and curing the gel, before to attaching the cap.

Another aspect of the above embodiment provides that the method further includes: attaching a backside signal connection structure to the carrier, wherein a first surface of the backside signal connection structure is exposed at the first major surface of the encapsulant material after the overmolding.

A further aspect of the above embodiment provides that the forming the interconnect structure includes forming a connection to the first surface of the backside signal connection structure.

Another further aspect of the above embodiment provides that the method further includes: backgrinding the encapsulant material to form a second major surface of the encapsulant material before removing the embedded pressure sensor die from the carrier, wherein a second surface of the backside signal connection structure is exposed at the second major surface of the encapsulant material.

Another aspect of the above embodiment provides that the pressure sensor die further includes at least one pad exposed at the first major surface of the encapsulant material, and the forming the interconnect structure includes forming a connection to the at least one pad of the pressure sensor die.

Another aspect of the above embodiment provides that the method further includes: prior to the overmolding, attaching to the carrier one or more of: an integrated circuit (IC) component including a radio frequency (RF) transmitter, and a gyroscope sensor die, wherein the forming the interconnect structure includes forming a connection between the pressure sensor die and the one or more of the IC component and the gyroscope sensor die.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

As used herein, the terms "substantial" and "substantially" mean sufficient to achieve the stated purpose or value in a practical manner, taking into account any minor imperfections or deviations, if any, that arise from usual and expected process abnormalities that may occur during wafer fabrication, which are not significant for the stated purpose or value. Also as used herein, the terms "approximately" and "about" mean a value close to or within an acceptable range of an indicated value, amount, or quality, which also includes the exact indicated value itself.

Although the invention is described herein with reference to specific embodiments, various modifications and changes can be made without departing from the scope of the present invention as set forth in the claims below. For example, additional or fewer components may be implemented in the device structure 100 of FIG. 1. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A packaged electronic device comprising:
   a pressure sensor die having a diaphragm on a front side;
   an encapsulant material that encapsulates the pressure sensor die, wherein the front side of the pressure sensor die is exposed at a first major surface of the encapsulant material;
   an interconnect structure formed over the front side of the pressure sensor die and the first major surface of the encapsulant material, wherein an opening through the interconnect structure is generally aligned to the diaphragm; and
   a cap directly attached to an outer dielectric layer of the interconnect structure, the cap being an integral structure having a vent hole generally aligned with the opening through the interconnect structure, wherein the cap, except for the vent hole, covers an entirety of the outer dielectric layer of the interconnect structure.

2. The packaged electronic device of claim 1, wherein the cap comprises a metal lid.

3. The packaged electronic device of claim 1, wherein the cap comprises a cured epoxy sheet.

4. The packaged electronic device of claim 1, further comprising:
   a gel present within the opening of the interconnect structure.

5. The packaged electronic device of claim 1, wherein a distance from the diaphragm to the cavity in the cap is less than 50 microns.

6. The packaged electronic device of claim 1, further comprising:
   a backside signal connection having a first surface exposed at the first major surface of the encapsulant material and connected to the interconnect structure, and a second surface exposed at a second major surface of the encapsulant material.

7. The packaged electronic device of claim 6, further comprising:
   a plurality of backside signal connections located around a periphery of the packaged electronic device.

8. The packaged electronic device of claim 7, further comprising:
   a plurality of solder bumps attached to the plurality of backside signal connections.

9. The packaged electronic device of claim 1, wherein the pressure sensor die further comprises at least one pad exposed at the first major surface of the encapsulant material and connected to the interconnect structure.

10. The packaged electronic device of claim 1, further comprising:
   an integrated circuit (IC) component comprising a radio frequency (RF) transmitter, the IC component having at least one pad exposed at the first major surface of the encapsulant material and communicatively coupled to the pressure sensor die through the interconnect structure.

11. The packaged electronic device of claim 10, further comprising:
   a gyroscope sensor die communicatively coupled to the IC component through the interconnect structure.

12. The packaged electronic device of claim 1, wherein the opening through the interconnect structure has sloped walls formed with the encapsulant material with a narrowest portion of the opening being closest to the diaphragm on the front side of the pressure sensor die.

* * * * *